(12) United States Patent
Brick et al.

(10) Patent No.: US 11,054,552 B2
(45) Date of Patent: Jul. 6, 2021

(54) OPTOELECTRONIC LIGHTING APPARATUS AND DISPLAY DEVICE

(71) Applicant: OSRAM Opto Semiconductors GmbH, Regensburg (DE)

(72) Inventors: Peter Brick, Regensburg (DE); Christopher Wiesmann, Barbing (DE)

(73) Assignee: OSRAM OLED GmbH, Regensburg (DE)

( * ) Notice: Subject to any disclaimer, the term of this patent is extended or adjusted under 35 U.S.C. 154(b) by 144 days.

(21) Appl. No.: 16/067,364

(22) PCT Filed: Dec. 29, 2016

(86) PCT No.: PCT/EP2016/082883
§ 371 (c)(1),
(2) Date: Jun. 29, 2018

(87) PCT Pub. No.: WO2017/118595
PCT Pub. Date: Jul. 13, 2017

(65) Prior Publication Data
US 2019/0025479 A1    Jan. 24, 2019

(30) Foreign Application Priority Data
Jan. 4, 2016   (DE) .................... 10 2016 100 063.9

(51) Int. Cl.
*G02B 5/00*         (2006.01)
*G02B 5/02*         (2006.01)
(Continued)

(52) U.S. Cl.
CPC ...... *G02B 5/0284* (2013.01); *B29D 11/00326* (2013.01); *G02B 3/08* (2013.01); *G02B 5/0221* (2013.01); *G02B 6/0036* (2013.01); *G02B 6/0038* (2013.01); *G02B 6/0055* (2013.01); *G02F 1/133603* (2013.01);
(Continued)

(58) Field of Classification Search
CPC ...... G02B 3/08; G02B 5/0221; G02B 5/0036; G02B 5/0038; G02B 6/0073; G02B 5/0284; G02F 1/133603; G02F 1/133606; G02F 1/133611; G02F 1/133607
See application file for complete search history.

(56) References Cited

U.S. PATENT DOCUMENTS 6,111,696 A * 8/2000 Allen ..................... G02B 5/305
                                                    359/487.02
7,072,096 B2   7/2006 Holman et al.
(Continued)

FOREIGN PATENT DOCUMENTS

DE       101 02 586 A1    7/2002
WO     2010/141261 A2    12/2010
WO     2012/120332 A1     9/2012

*Primary Examiner* — Gerald J Sufleta, II
(74) *Attorney, Agent, or Firm* — DLA Piper LLP (US)

(57) ABSTRACT

An optoelectronic lighting apparatus includes a reflector having a reflector face, an optical component arranged at a distance from the reflector face and opposite the reflector face, and a light-emitting component arranged on the reflector face and having a light-emitting face, wherein the optical component has a plurality of differently configured reflection elements for reflection, in a direction of the reflector face, of electromagnetic radiation emitted by the light-emitting face.

20 Claims, 12 Drawing Sheets

(51) Int. Cl.
  *G02F 1/13357* (2006.01)
  *F21V 8/00* (2006.01)
  *G02B 3/08* (2006.01)
  *B29D 11/00* (2006.01)
  *H01L 33/58* (2010.01)
  *H01L 25/075* (2006.01)
  *G02F 1/1335* (2006.01)

(52) U.S. Cl.
  CPC .. *G02F 1/133606* (2013.01); *G02F 1/133611* (2013.01); *H01L 33/58* (2013.01); *G02F 1/133605* (2013.01); *G02F 1/133607* (2021.01); *H01L 25/0753* (2013.01)

(56) References Cited

U.S. PATENT DOCUMENTS

| | | |
|---|---|---|
| 2003/0016539 A1 | 1/2003 | Minano et al. |
| 2004/0080938 A1 | 4/2004 | Holman et al. |
| 2006/0067078 A1* | 3/2006 | Beeson ................ G02B 17/04 362/327 |
| 2006/0072203 A1* | 4/2006 | Lee ...................... G02B 5/045 359/625 |
| 2008/0100540 A1* | 5/2008 | Li ....................... H01L 51/5275 345/76 |
| 2008/0247172 A1* | 10/2008 | Beeson ................ G02B 17/04 362/308 |
| 2008/0247192 A1* | 10/2008 | Hoshi ................ G02F 1/13362 362/627 |
| 2008/0316761 A1 | 12/2008 | Minano et al. |
| 2009/0079909 A1* | 3/2009 | Ouderkirk ......... G02F 1/133536 349/67 |
| 2010/0046204 A1* | 2/2010 | Shinkai ............ G02F 1/133611 362/97.1 |
| 2010/0165634 A1* | 7/2010 | Hong .................... G02B 5/045 362/307 |
| 2010/0232136 A1 | 9/2010 | Bang et al. |
| 2015/0043197 A1* | 2/2015 | Chen ...................... G02B 3/00 362/97.3 |
| 2015/0226400 A1* | 8/2015 | Wada ...................... F21V 7/04 362/97.1 |

\* cited by examiner

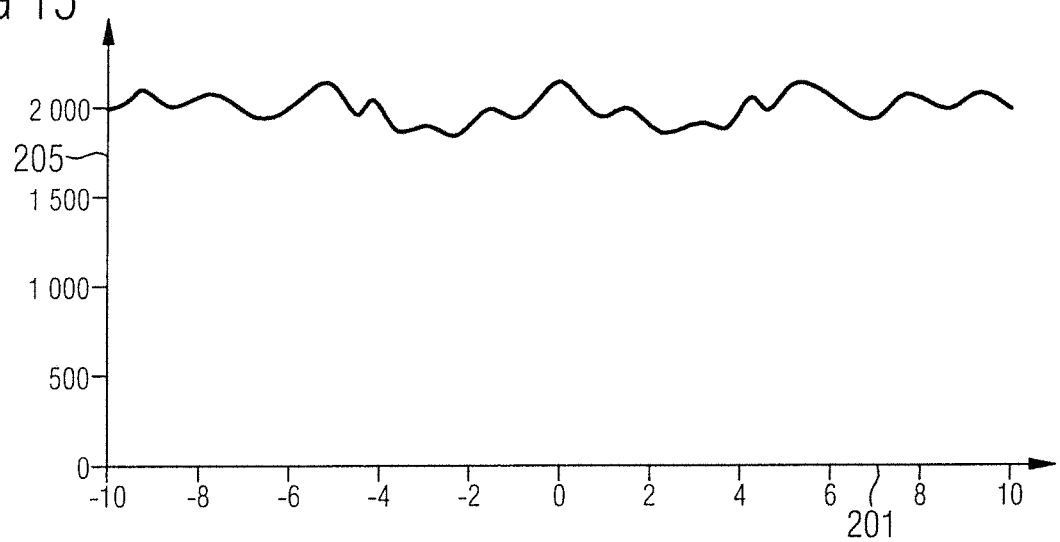
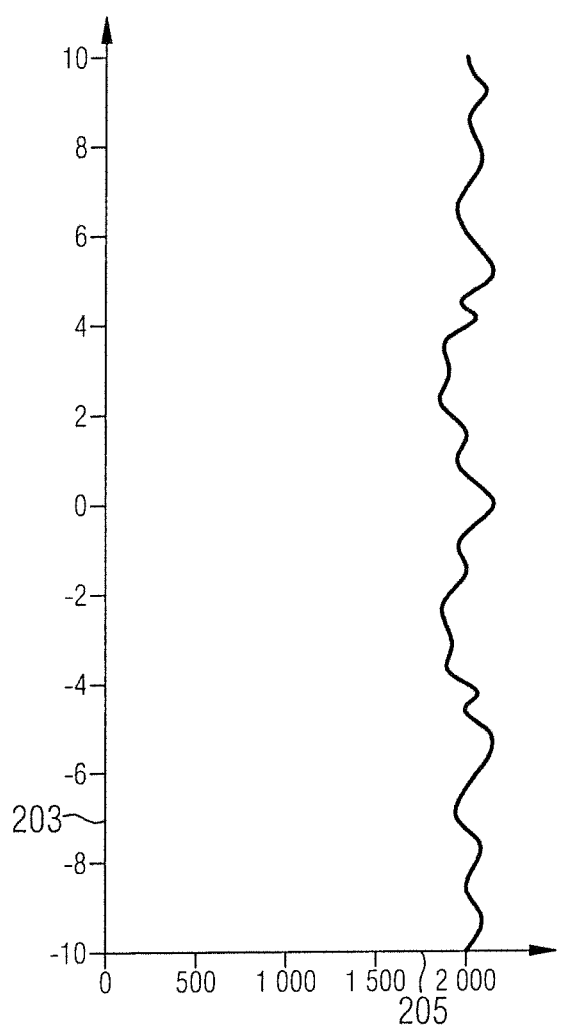

OPTOELECTRONIC LIGHTING APPARATUS AND DISPLAY DEVICE

TECHNICAL FIELD

This disclosure relates to an optoelectronic lighting apparatus and a display device.

BACKGROUND

Light-emitting diodes with Lambertian emission produce a very inhomogeneous distribution (proportional to $\cos^4$) on a face located at a distance. This means that the light-emitting diodes generally need to be placed very close together for a homogeneous backlighting. In general, the diodes should be placed at a distance from one another with a ratio of a distance of the light-emitting diodes to a thickness of the backlighting unit (distance between the light-emitting diodes in the face to be illuminated) of <1.

A secondary lens is generally fitted behind each light-emitting diode to increase the aforementioned ratio. Such secondary lenses are, for example, of the Argus or TIR (total internal reflection) type. This generally requires a narrow tolerance in the production of these secondary lenses, as well as in the positioning of light emitting diodes with respect to the secondary lenses. The tolerances are usually <100 µm.

It could therefore be helpful to provide an efficient concept for efficient illumination of a face to be illuminated.

SUMMARY

We provide an optoelectronic lighting apparatus including a reflector having a reflector face; an optical component arranged at a distance from the reflector face and opposite the reflector face; and a light-emitting component arranged on the reflector face and having a light-emitting face, wherein the optical component has a plurality of differently configured reflection elements for reflection, in a direction of the reflector face, of electromagnetic radiation emitted by the light-emitting face.

We also provide a display device including a face to be illuminated; and the optoelectronic lighting apparatus including a reflector having a reflector face; an optical component arranged at a distance from the reflector face and opposite the reflector face; and a light-emitting component arranged on the reflector face and having a light-emitting face, wherein the optical component has a plurality of differently configured reflection elements for reflection, in a direction of the reflector face, of electromagnetic radiation emitted by the light-emitting face, wherein the optical component is arranged between the reflector and the face to be illuminated.

BRIEF DESCRIPTION OF THE DRAWINGS

FIGS. 15 and 16 respectively show a detail of the illuminance distribution of FIG. 14.

Figure 1:
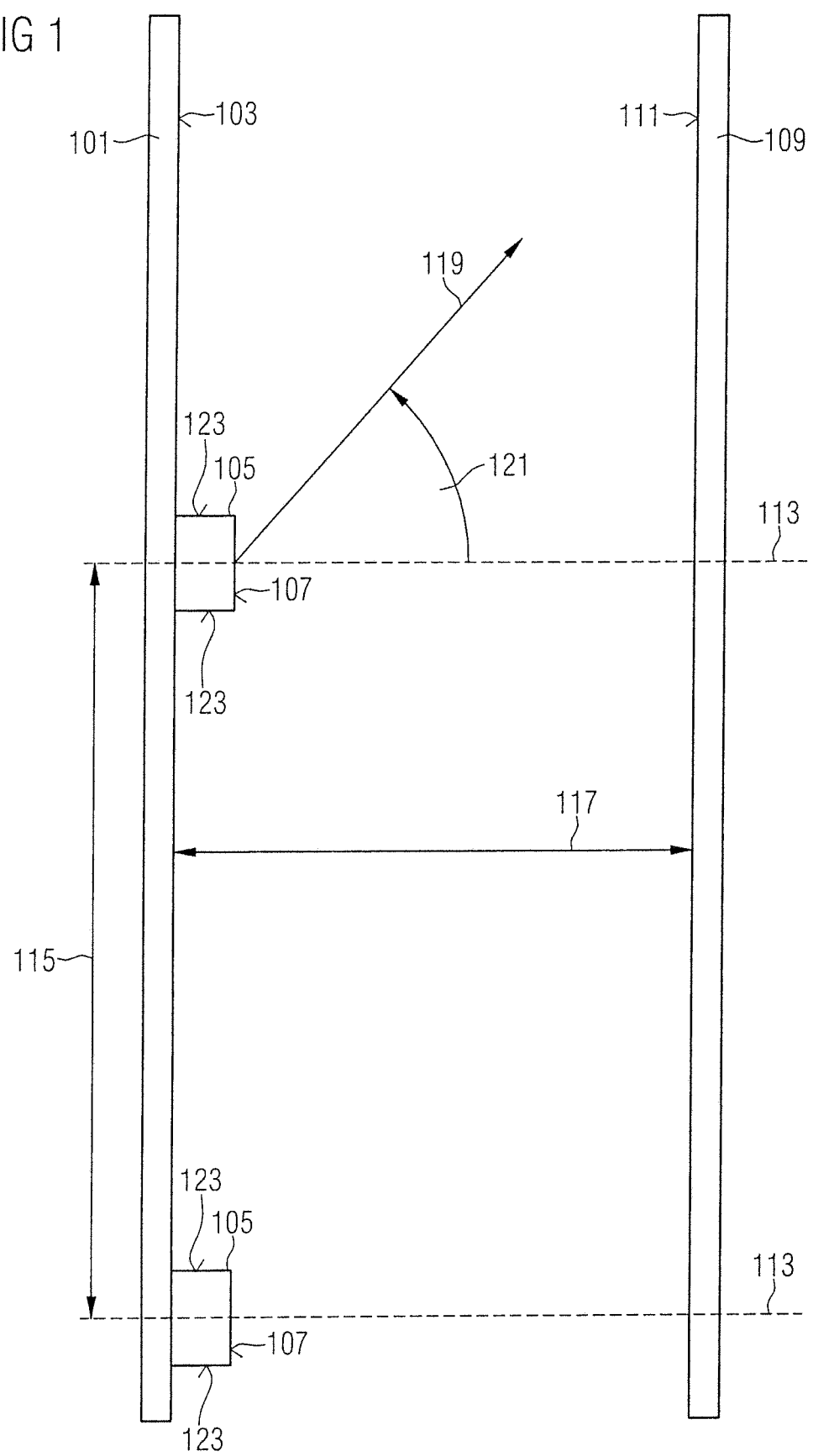
FIG. 1 shows light-emitting components which illuminate a face to be illuminated.

LIST OF REFERENCES 101 reflector
103 reflector face
105 light-emitting component
107 light-emitting face
109 liquid-crystal display
111 face to be illuminated
113 normal of the light-emitting face
115 distance between two light-emitting components
117 distance between the reflector and the liquid-crystal display
119 light ray
121 angle between the normal 113 and the light ray 119
123 side face
201 x axis
203 y axis
205 illuminance
501 optical component
503 lower side of the optical component
504 reflection element
505 prismatic section
507, 509 side
510 axis
511, 513 reflected light
515 apex
517 base face
601 reflection element
603 axis
609 side
611 refracted light ray
613, 615 reflected light
617 emerging light ray
619 normal
621 angle between the normal 619 and the axis 603
701 angle of incidence
801 x axis
803 y axis
805 curve
901 optoelectronic lighting apparatus
903 display device
1200 optoelectronic lighting apparatus
1201 optical component
1203, 1205, 1207 reflection elements
1209 ray profiles
1301 truncation line

DETAILED DESCRIPTION

Our optoelectronic lighting apparatus may comprise:
a reflector having a reflector face,
an optical component arranged at a distance from the reflector face and opposite the reflector face, and a light-emitting component arranged on the reflector face and has a light-emitting face, wherein the optical component has a plurality of differently configured reflection elements for reflection, in the direction of the reflector face, of electromagnetic radiation emitted by the light-emitting face.

Our display device may comprise:

a face to be illuminated, and the optoelectronic lighting apparatus, wherein the optical component is arranged between the reflector and the face to be illuminated.

We discovered that efficient illumination of a face to be illuminated is possible by arranging, between the reflector and the face to be illuminated, an optical component having a plurality of differently configured reflection elements. These reflection elements reflect electromagnetic radiation, which is emitted by the light-emitting face, back in the direction of the reflector face. The back-reflected electromagnetic radiation can therefore advantageously be reflected by the reflector in the direction of the optical component, a more homogeneous illuminance distribution of the electromagnetic radiation emitted by the lighting apparatus then being obtained overall, because of this new reflection, than without the optical component. The new reflection thus broadens the original emission characteristic of the light-emitting component.

For example, the reflector is configured for diffuse reflection. The reflector may therefore, in particular, advantageously diffusely rearrange the back-reflected electromagnetic radiation.

The optical component reflects the electromagnetic radiation only partially, and a part of the electromagnetic radiation will thus always shine through the component so that electromagnetic radiation can strike the face.

Because the plurality of reflection elements of the optical component are configured differently, the technical advantage is achieved in particular that efficient back-reflection and, therefore, efficient homogenization of the emitted electromagnetic radiation, can be achieved. This is because the emitted electromagnetic radiation is generally divergent electromagnetic radiation and has a predetermined illuminance distribution. This means that light at different positions on the optical component strikes the optical component at different angles of incidence. To this extent, a particular configuration of a reflection element can generally reflect back the emitted electromagnetic radiation optimally in the direction of the reflector face only at a particular position or at a particular location. It is therefore generally not possible to design a universal reflection element that always reflects the emitted electromagnetic radiation equally well at any position. This fact is therefore taken into account by using differently configured reflection elements so that the disadvantages that arise because of the divergent electromagnetic radiation and the predetermined illuminance distribution can be overcome.

Therefore, in particular, a technical advantage is achieved that an illuminance distribution of the electromagnetic radiation emitted by the light-emitting face is broadened because of this multiple reflection. In this way, in particular, the technical advantage is achieved that the face to be illuminated can be illuminated more homogeneously than without the component.

Therefore, in particular, a technical advantage is thus achieved that an efficient homogeneous illumination of the face to be illuminated is made possible.

A light-emitting component is, for example, a light-emitting diode. A light-emitting component is, for example, a laser diode. For example, the light-emitting component is configured as an optoelectronic semiconductor chip, in particular as a light-emitting diode chip or as a laser diode chip.

The laser diode chip is, for example, configured as a volume emitter or as a top emitter.

The light-emitting component is located between the reflector and the optical component.

The light-emitting component has, in particular, a Lambertian emission characteristic.

The light-emitting face may face away from the reflector face.

The light-emitting face may face toward the optical component. The optical component is therefore, in particular, opposite the light-emitting face.

The light-emitting face may be, for example, at least partially formed by two opposite side faces of the light-emitting component. This thus means, in particular, that the component emits electromagnetic radiation by its two opposite side faces.

The light-emitting face may be formed at least partially by an upper side of the light-emitting component. This thus means, in particular, that the component emits electromagnetic radiation by its upper side.

The light-emitting face may be formed by two opposite side faces and the upper side of the component. This thus means that the component emits electromagnetic radiation by its upper side and its two opposite side faces.

The reflector face of the reflector is thus, in particular, configured to reflect electromagnetic radiation.

Electromagnetic radiation refers, in particular, to electromagnetic radiation in a wavelength range of 380 nm to 780 nm, i.e., radiation visible to the human eye. This thus means that the electromagnetic radiation is, for example, light. When the term "light" is used, this is always generally also intended to mean electromagnetic radiation, and vice versa.

Electromagnetic radiation comprises, in particular, an infrared wavelength range, i.e., in particular a wavelength range of 780 nm to 1 mm.

The plurality of reflection elements may at least partially comprise a total reflection section for total reflection of at least one part of the emitted electromagnetic radiation in the direction of the reflector face.

In this way, in particular, a technical advantage is achieved that efficient back-reflection of the emitted electromagnetic radiation can be achieved. This means that at least a part of the emitted electromagnetic radiation is totally reflected back in the direction of the reflection face by the total reflection sections.

The respective total reflection section may be an element selected from the following group of total reflection sections: pyramidal section, conical section, and prismatic section.

In this way, in particular, a technical advantage is achieved that efficient total reflection can be achieved by these total reflection sections. A pyramidal section is configured as a pyramid. A conical section is thus configured as a cone. A prismatic section is thus configured as a prism. Prisms, pyramids or cones are particularly preferred and efficient means in geometrical optics for efficient total reflection of a light ray, in general electromagnetic radiation.

A pyramid, a cone and a prism respectively have a base face, forming an entry face for the emitted electromagnetic radiation. At a distance from the base face, a pyramid, a cone and a prism respectively have an apex. This apex (which because of manufacturing tolerances need not be a perfectly formed apex, and the apex is, for example, formed as a rounded or truncated apex) faces away from the reflector face. The base face faces toward the reflector face. Emitted electromagnetic radiation can thus enter the pyramid, the cone or the prism through the base face, and can then be reflected at the lateral face of the cone, or of the pyramid, or of the prism, back in the direction of the base face to then emerge out of the optical component again to shine in the direction of the reflector face. In particular, depending on the angle of incidence into the optical component and a specific geometrical configuration of the total reflection section, total reflection is achieved by the corresponding total reflection section for the electromagnetic radiation incident at a particular angle of incidence. For electromagnetic radiation entering the optical component at a different angle of incidence even though total reflection is no longer achieved by the corresponding total reflection section, partial reflection is still achieved.

The base face is, for example, quadrilateral or triangular.

In the aforementioned total reflection sections, a straight line is defined which extends from the apex to a midpoint of the base face. This straight line may also be referred to as an axis of the total reflection section.

Should the apex not be perfectly formed, for definition or auxiliary construction of this straight line the point of intersection of the imaginary extension of the mutually converging side faces of the total reflection section is used instead of the apex.

A respective angle between a straight line extending from an apex of the total reflection section to a midpoint of a base face of the total reflection section and a normal of the reflector face for reflection elements with a larger lateral distance from the light-emitting component may be greater than for reflection elements with a smaller lateral distance from the light-emitting component.

The total reflection sections are thus inclined or tilted with their axis in the direction of the reflector face, and specifically tilted commensurately more when the reflection elements are further away laterally from the light-emitting component. In this way, in particular, the technical advantage is achieved that the emitted electromagnetic radiation is reflected efficiently by the reflection elements back in the direction of the reflector face. The prism is thus formed as an oblique prism. The pyramid is thus formed as an oblique pyramid. The cone is thus formed as an oblique cone. In this case, the following applies in particular: for total reflection sections further away the corresponding total reflection section is more oblique than for total reflection sections less far away.

In this way, furthermore, a technical advantage is achieved in particular that efficient total reflection can be achieved even for emitted electromagnetic radiation not emitted perpendicularly relative to the light-emitting face, but emitted at an angle to the normal of the light-emitting face of the light-emitting component. The greater this angle is, i.e., the more the electromagnetic radiation is emitted laterally (relative to the light-emitting component), the more it is expedient for the total reflection sections to be inclined with their axis in the direction of the reflector face to achieve efficient total reflection. This is thus achieved by an angle between the respective axis and a normal of the reflector face being larger with an increasing lateral distance of the reflection elements from the light-emitting component.

The lateral distance of a reflection element is, for example, defined as a lateral distance between a normal of the light-emitting face, extending through the midpoint of the light-emitting face, and the reflection element, in particular between a normal of the light-emitting face, extending through the midpoint of the light-emitting face, and a normal of the optical component, that extends through a point of intersection of the axis of the total reflection section with a lower side facing toward the reflector face of the optical component.

The respective angle may be proportional to arcsin(1/ n*sin(arctan(r/d))), preferably with a tolerance of, for example, plus/minus 10 degrees, in particular plus/minus 5 degrees, where n is a refractive index of the optical component, d is a distance of the light-emitting face from the optical component, and r is the lateral distance of the corresponding reflection element from the light-emitting component.

In this way, in particular, a technical advantage is achieved that particularly efficient total reflection of the emitted electromagnetic radiation is made possible over a correspondingly large solid angle.

The reflection elements may at least partially have a side face oriented parallel to the respective straight line and arranged closer to the light-emitting component than the total reflection section is. Such side faces have an angle of, for example, 10 degrees, in particular 5 degrees with respect to the straight line because of manufacturing tolerances, are also referred to as parallel to the respective straight line.

In this way, in particular, a technical advantage is achieved that it is possible to prevent shadowing of the electromagnetic radiation incident and then travelling in the component, before the incident electromagnetic radiation enters a total reflection section through the base face. In this way, in particular, the technical advantage is achieved that a luminous efficiency, in general a yield of electromagnetic radiation, can be increased. Therefore, in particular, the technical advantage is achieved that the face to be illuminated can be illuminated efficiently.

A lower side, facing toward the reflection face, of the optical component may be structured and/or curved.

In this way, in particular, a technical advantage is achieved that the lower side can likewise contribute to reflection of emitted electromagnetic radiation in the direction of the reflector face. In this way, efficient back-reflection is therefore advantageously achieved.

The plurality of reflection elements may be arranged concentrically around the light-emitting component or linearly.

The concentric arrangement achieves, in particular, the advantage that efficient and uniform back-reflection of the emitted electromagnetic radiation are achieved. A linear arrangement achieves, in particular, a technical advantage that the face to be illuminated can be efficiently illuminated linearly.

That the plurality of reflection elements may be arranged concentrically around the light-emitting component means, in particular, that the plurality of reflection elements are arranged along a circle or along a plurality of circles with different radii, a midpoint of the circle or circles being established by the light-emitting component. For example, a midpoint of the light-emitting face forms the center of the circle, or of the plurality of circles.

The optical component may be formed as an extruded or injection-molded optical component.

In this way, in particular, a technical advantage is achieved that the optical component is produced efficiently.

An extruded component refers to a component produced by an extrusion method. For example, the optical component is formed by a film. Films can generally be produced technically simply and economically. Therefore, a technical advantage is thus achieved that the optical component can be or is produced technically simply and economically.

An injection-molded optical component refers to a component produced by an injection-molding method. Efficient, simple and economical production of the component is also advantageously made possible by such a method.

The plurality of reflection elements may be formed as stamped reflection elements.

In this way, in particular, a technical advantage is achieved that the reflection elements are produced efficiently. Stamped reflection elements therefore refer, in particular, to reflection elements having been stamped. Such a stamping method advantageously makes it possible to produce the geometrical shapes required for total reflection, efficiently and simply.

A plurality of light-emitting components may be arranged on the reflector face with their respective light-emitting face facing away from the reflection face, wherein a mirror axis extending perpendicularly to the optical component and centrally between two light-emitting components is defined so that two sections of the optical component formed mirror-symmetrically and comprise reflection elements are formed on both sides of the mirror axis, these sections respectively extending from the mirror axis to a distance from the optical axis which corresponds to half the distance between the two corresponding light-emitting components.

In this way, in particular, a technical advantage is achieved that efficient and uniform back-reflection is likewise made possible in a plurality of light-emitting components.

Beyond a predetermined lateral distance from the light-emitting component, the reflection elements may be configured such that the total reflection of the at least one part of the emitted electromagnetic radiation is reduced or stopped.

In this way, in particular, a technical advantage is achieved that, beyond a predetermined lateral distance from the light-emitting component, transmission through the optical component is improved so that efficient and homogeneous illumination of the face to be illuminated is made possible.

The expression "optical" in the expression "optical component" means, in particular, that the component is formed from a material having a transmission for the emitted electromagnetic radiation of at least 90%, in particular 95%, for example, 99%. This thus means that the optical component is formed from a material at least partially, in particular fully, transparent for the emitted electromagnetic radiation. Instead of the expression material, the expression "substance" may also be used.

For example, the optical component may be formed from one or more of the following elements: epoxy resin, polycarbonate (PC), silicone, glass and polymethyl methacrylate (PMMA).

The optoelectronic lighting apparatus may form a backlighting unit for backlighting (or illumination) of a face of a display device. The optoelectronic lighting apparatus may therefore, in particular, be referred to as a backlighting unit, in particular as a backlighting unit for a display device.

The face to be illuminated or backlit may be contained in a liquid-crystal display (LCD).

The display device may therefore comprise a liquid-crystal display having, for example, a face to be illuminated or, for example, a face to be backlit.

A plurality of light-emitting components may be arranged on the reflector face, in particular with their respective light-emitting face facing away from the reflector face. In particular, the components are arranged periodically.

The reflection elements may be arranged as a plurality of concentric rings or circles, in particular as interrupted rings or interrupted circles, a respective midpoint or a respective center of these rings or circles being established by the midpoints of the reflection elements.

The reflection elements may be arranged as a polygon.

The expression "respectively" comprises, in particular, the expression "and/or."

The above-described properties, features and advantages, as well as the way in which they are achieved, will become more clearly and readily comprehensible in conjunction with the following description of examples, which will be explained in more detail in connection with the drawings.

In what follows, the same reference signs may be used for the same features. For the sake of clarity, not all features are always provided with a reference sign in all the drawings.

FIG. 1 shows a reflector 101 comprising a reflector face 103. Two light-emitting components 105 are arranged on the reflector face 103. According to one example, the light-emitting components are light-emitting diodes.

The light-emitting components 105 respectively have a light-emitting face 107. The respective light-emitting face faces away from the reflector face 103. The light-emitting face 107 is formed on an upper side of the component 105.

The light-emitting components 105 emit light, for example, through the light-emitting faces 107. In one example (not shown), instead of or in addition to the upper side, the light-emitting component 105 may emit electromagnetic radiation, in particular the light, through to opposite side faces 123. Then, the light-emitting face may be formed at least partially by the opposite side faces 123, and respectively by the upper side.

Furthermore a liquid-crystal display 109 is provided and has a face 111 to be illuminated. This face 111 to be illuminated faces toward the reflector face 103.

The reflector, with the light-emitting components 105, therefore forms a backlighting unit for the liquid-crystal display 109.

Light-emitting diodes generally have an illuminance distribution following the Lambertian emission law. This means that the illuminance distribution satisfies the following equation:

$I(theta) = I_0 * cos(theta).$ $I_0$ denotes the intensity of the light emitted perpendicularly to the light-emitting face 107, i.e., parallel to a normal 113 at the light-emitting face 107.

Theta denotes the angle of a light ray 119, emitted by the light-emitting face 107, with respect to the normal 113.

The corresponding illuminance distribution due to a light-emitting component 105 on the face 111 therefore satisfies the following equation:

$E(theta) = E_0 * cos^4(theta).$ $E_0$ denotes the illuminance perpendicular to the light-emitting face 107.

The Lambertian emission characteristic of a light-emitting diode leads to a very inhomogeneous illuminance distribution on the face 111.

This thus leads to a relatively large amount of light immediately over the light-emitting component 105, and only relatively little light in the gaps between neighboring light-emitting components 105.

A distance a between two light-emitting components 105 is denoted by a double arrow with the reference sign 115.

The distance a is defined as the distance between the respective midpoint of the light-emitting faces 107.

A thickness, or a distance d between the reflector face 103 and the face 111, is denoted by a double arrow with the reference sign 117.

Figure 2:
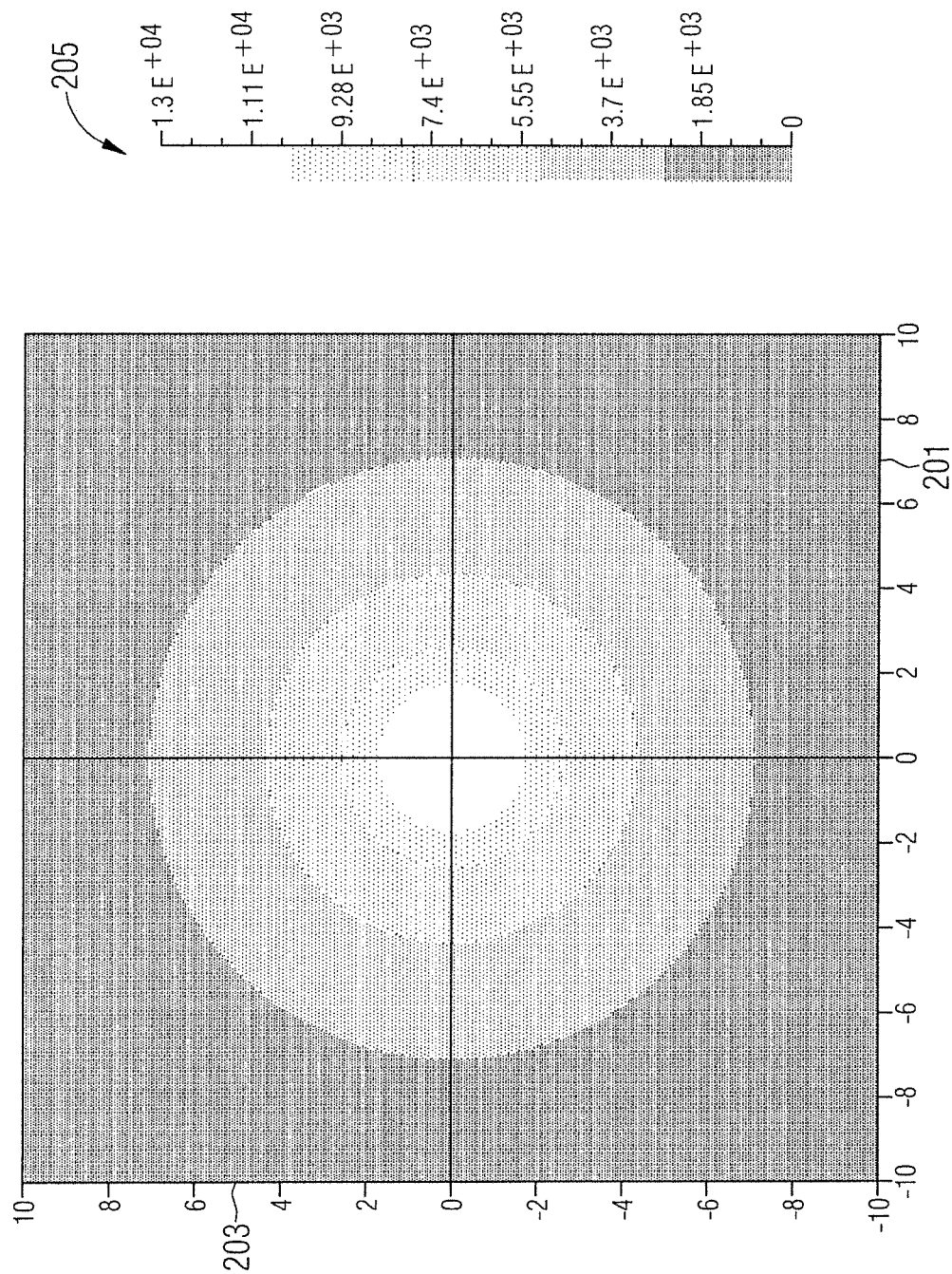
FIG. 2 shows a graphical representation of an illuminance distribution of a light-emitting component.

FIG. 2 shows an illuminance distribution on the face 111 for a distance a between two light-emitting components 105 of 20 mm and a thickness d of 5 mm.

The axis with the reference sign 201 is the x axis, and indicates a lateral distance on the face 111 relative to the midpoint of the light-emitting face 107 in millimeters.

The axis with the reference sign 203 is the y axis, and indicates a vertical distance, in relation to the lateral distance, on the face 111 relative to the midpoint of the light-emitting face 107 in millimeters.

Reference sign 205 shows a scale which indicates the illuminance in lux.

The illuminance distribution shown in FIG. 2 shows clearly that the majority of the illuminance is concentrated around the midpoint.

Figure 3:
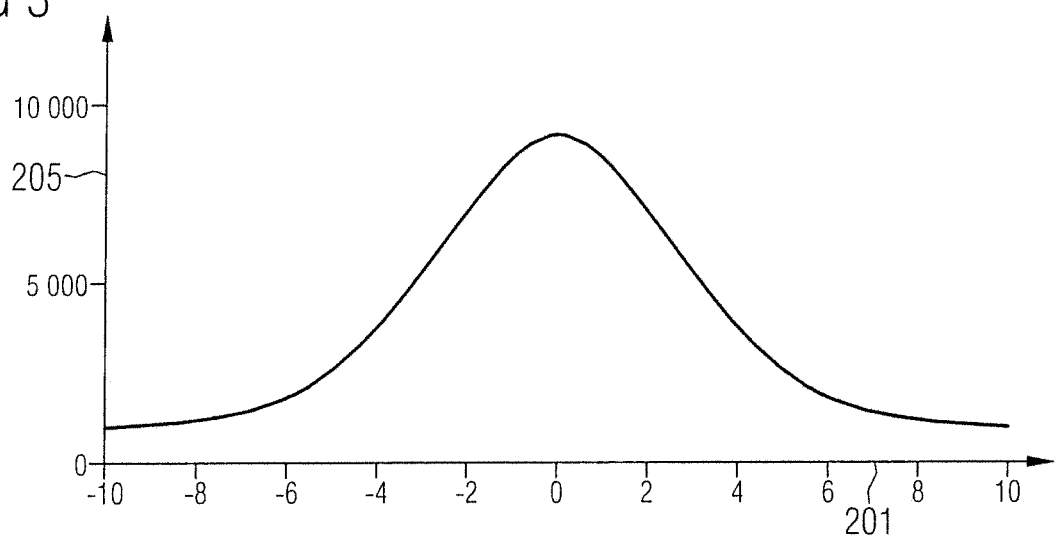
FIGS. 3 and 4 respectively show a detail of the illuminance distribution of FIG. 2.

FIG. 3 shows a section through the illuminance distribution of FIG. 2 for y=0 mm.

Figure 4:
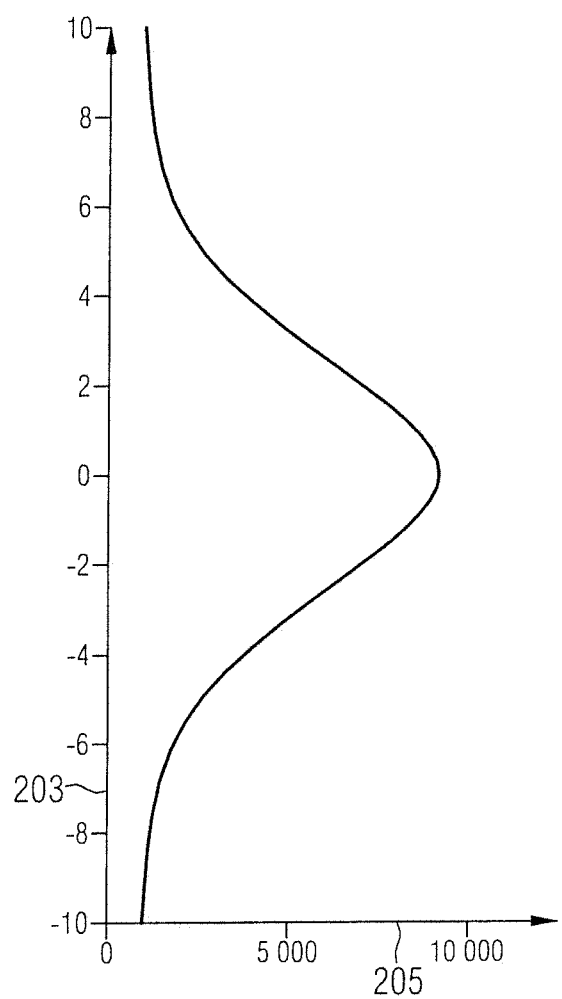

FIG. 4 shows a section through the illuminance distribution of FIG. 2 for x=0 mm.

Figure 5:
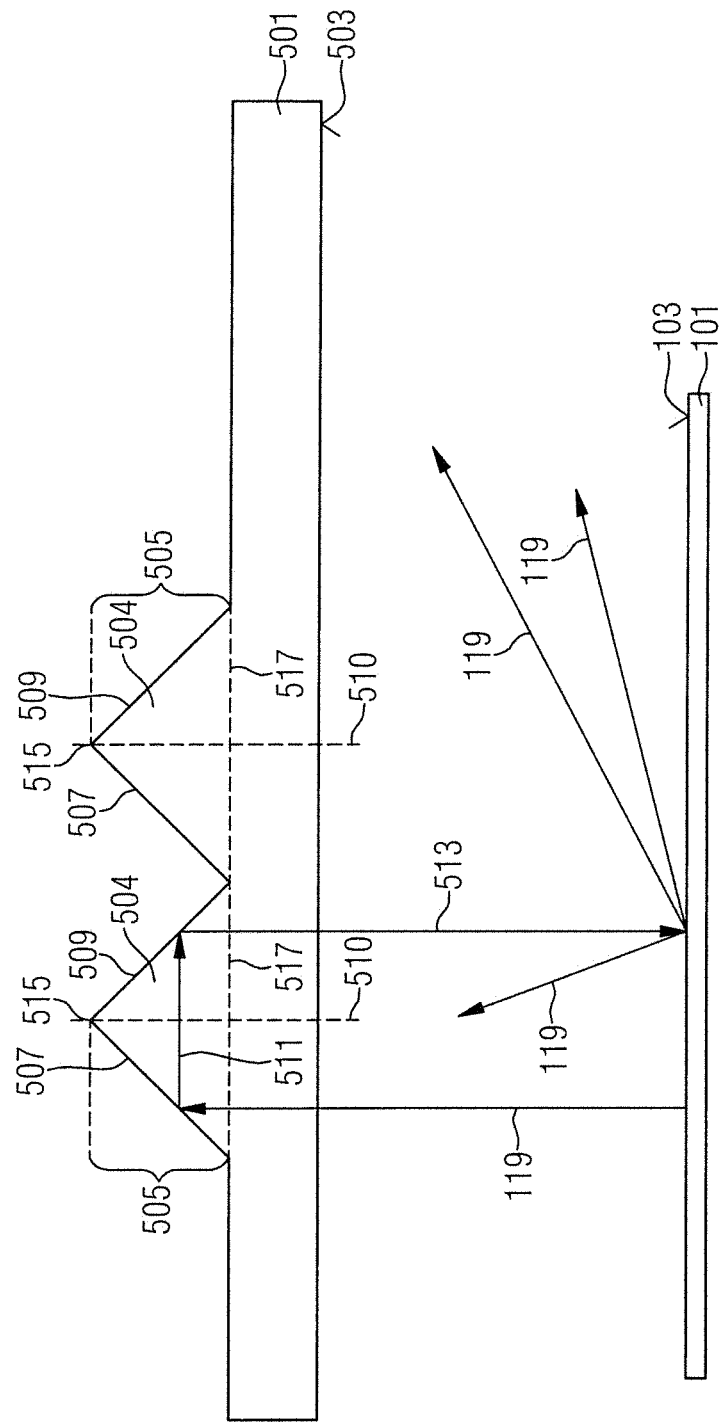
FIG. 5 shows an optical component in a section.

To homogenize this inhomogeneous illuminance distribution, according to one example, an optical component 501 is provided, which is shown in a lateral sectional view in FIG. 5 and is arranged between the light-emitting components 105 and the face 111.

The optical component 501 faces with its lower side 503 toward the reflector face 103. The optical component 501 has a plurality of reflection elements 504. The reflection elements 504 respectively have a prismatic section 505. The prismatic section 505 has, as its lateral face, a first side 507 and a second side 509, extending at an angle to the first side 507. The two sides 507, 509 meet at an apex 515 of the prismatic section 505. A respective axis of the prismatic sections 505 is denoted by the reference sign 510. A corresponding base of the two prismatic sections 505 is shown as a dashed line with the reference sign 517 because of the sectional view.

A light ray entering the prismatic section 505 at a distance from and parallel to the axis 510 is totally reflected back by the respective inner faces of the two sides 507, 509 in the direction of the reflector face 103.

A light ray entering the component 501 is denoted by an arrow with the reference sign 119. The light ray 119 strikes the inner face of the side 507, and is reflected thereby in the direction of the inner face of the side 509. This reflected light is represented symbolically by an arrow with the reference sign 511. This reflected light ray 511 strikes the inner face of the side 509 and is reflected thereby back in the direction of the reflector face 103. This back-reflected light is denoted by an arrow with the reference sign 513.

For the sake of clarity, no light-emitting component 105 is shown in FIG. 5. Only the electromagnetic radiation emitted by the light-emitting face 107 is represented symbolically by arrows with the reference signs 119.

The reflector face 103 itself is, for example, configured to be diffusely reflective and/or, for example, configured to be strongly scattering sideways, i.e., to be laterally scattering, in relation to a normal to the reflector face 103.

This thus means that light reflected by the reflection elements 504 back in the direction of the reflector face 103 can in turn be reflected diffusely or in a strongly laterally scattering fashion by the reflector face 103 so that an original Lambertian emission characteristic can be broadened or homogenized.

The optical component 501 has yet further reflection elements, which are not represented for reasons of depiction in FIG. 5, but are described and shown below with reference to the further figures.

Figure 6:
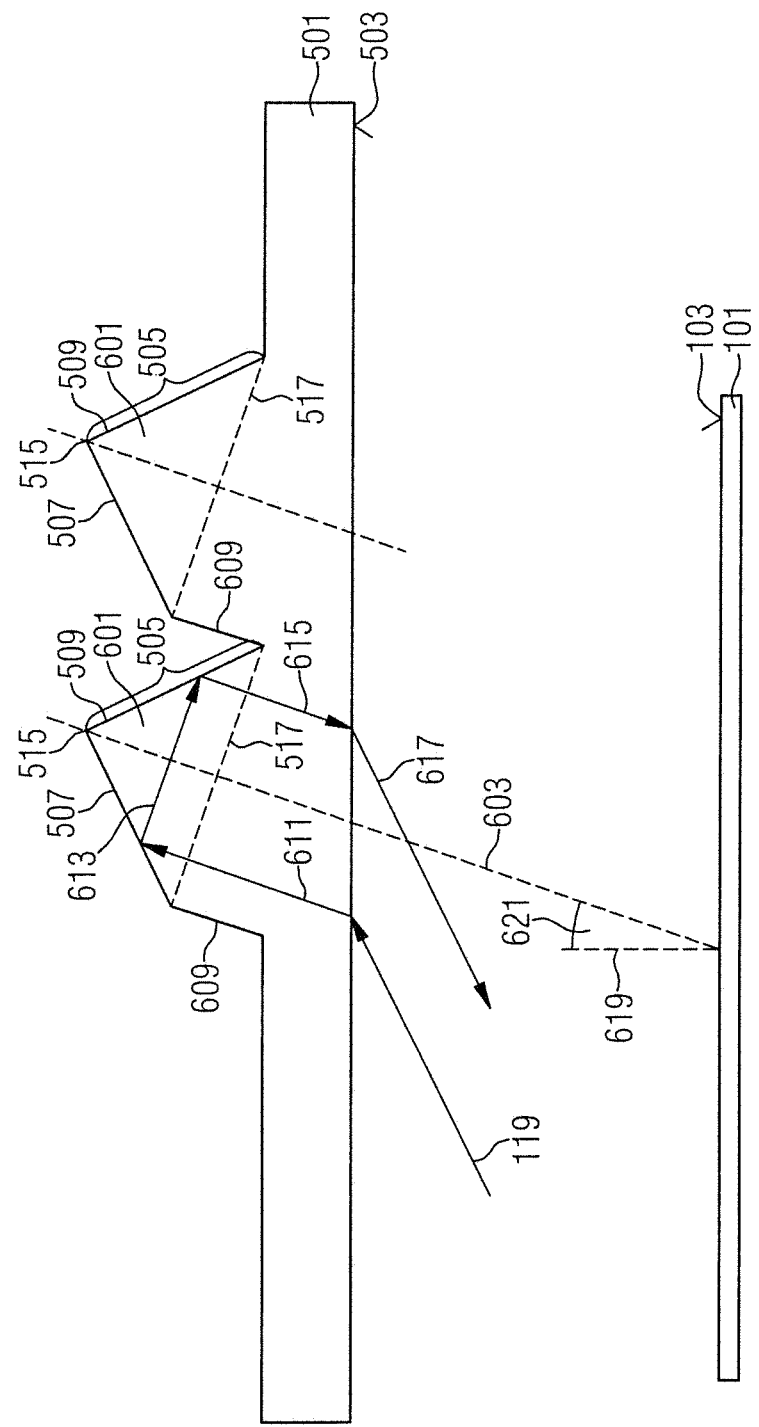
FIG. 6 shows the optical component of FIG. 5 in a further view.

FIG. 6 shows the optical component 501 with further reflection elements 601 in a lateral sectional view. These further reflection elements 601, in relation to the reflection elements 504 shown in FIG. 5, are configured differently therefrom. The reflection elements 601 are located further away laterally from the light-emitting component 105 than the reflection elements 504.

For the sake of clarity, the reflection elements 504 shown in FIG. 5 are not shown in FIG. 6.

In a similar way to the reflection elements 504, the reflection elements 601 respectively have a prismatic section 505, which is respectively tilted or inclined in the direction of the reflector face 103, i.e., in particular in the direction of the light-emitting components 105. This means that a respective axis 603 of the prismatic sections 505 no longer extends perpendicularly to the reflector face 103, or respectively to the light emitting face 107. Instead, an angle 621 is now formed between the respective axis 603 and a normal 619 of the reflector face 103, this angle 621 being >0 degrees, i.e., different than 0 degrees. The normal 619 correspond here to the normal of the lower side 503, insofar as this extends in a planar fashion and parallel to the reflector face 103.

Since the reflection elements 601 are laterally further away than the reflection elements 504, the incident light 119 will enter the reflection elements 601 at a larger angle of incidence relative to the reflection elements 504, which are essentially located directly over the light-emitting component 105.

The reflection elements 601 respectively have a side face 609 oriented parallel to the axis 603 and arranged closer to the light-emitting component 105 than the prismatic section 505.

An exemplary ray path is represented by arrows, which will be described in more detail below.

Reference sign 119 shows a light ray 119 emitted by the light-emitting face 107. This ray is refracted at the lower side 503 of the optical component 501. The light ray which has been refracted, and has therefore entered the optical component 501, is denoted by the reference sign 611.

The refracted light ray 611 is reflected at the inner face of the side 507 in the direction of the inner face of the side 509. This reflected light ray is denoted by the reference sign 613. At the inner face of the side 509, this light ray 613 is reflected in the direction of the lower side 503. This reflected light ray is denoted by the reference sign 615. By the emergence of the light ray 615 from the optical component 501, this light ray is refracted and reflected back in the direction of the reflector face 103, or respectively of the light-emitting component 105. This light ray, which has been reflected back and has therefore emerged from the component 501, is denoted by the reference sign 617.

Total reflection therefore also takes place for light, or electromagnetic radiation is emitted at an angle >0° by the light-emitting face relative to the normal of the light-emitting face.

If, however, the reflection elements 504 were used instead of the reflection elements 601, these reflection elements at this lateral distance from the light-emitting component 105 would not totally reflect the light as well as the reflection elements 601 do. The reason they would not is that the reflection elements 504 are not tilted in the direction of the reflector face 103.

Figure 7:
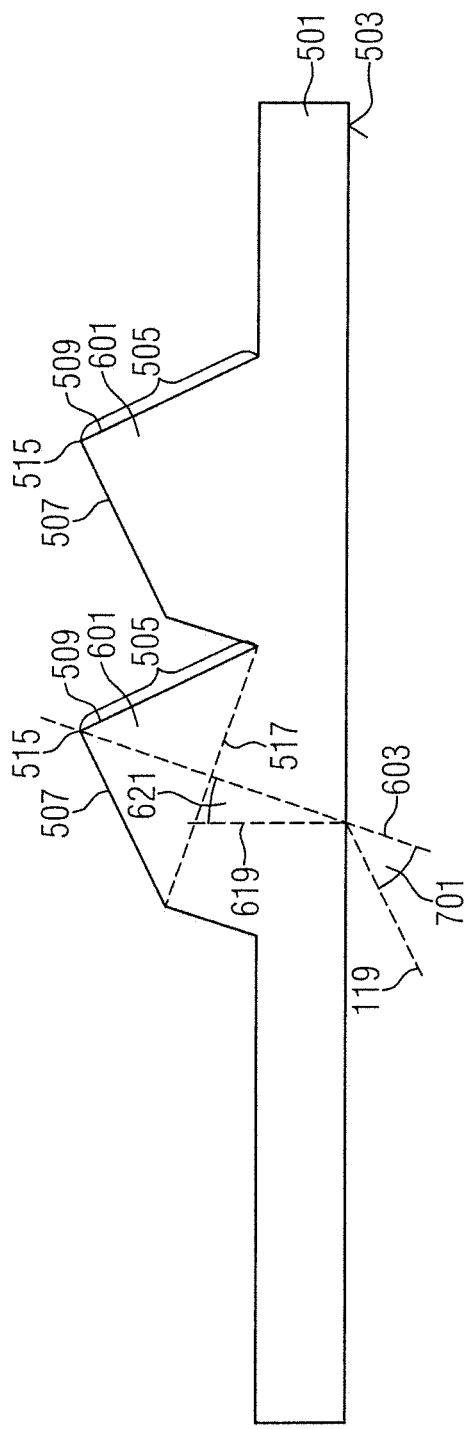
FIG. 7 shows the optical component according to FIG. 6.

FIG. 7 again shows the optical component with the reflection elements 601. Compared to the representation shown in FIG. 6, the angle of incidence 701 between the incident ray 119 and the normal 619 is also shown here in addition.

The angle 701 will be referred to below as "theta_in," "in" standing for "incident ray." The angle 621 will be referred to below as "theta_tilt," "tilt" standing for "tilted axis," insofar as the axis 603 is tilted or inclined in the direction of the light-emitting components 105 relative to the axis 510.

According to one example, the following equation applies:

$$\text{theta\_in} = \arctan(r/d).$$

In contrast to FIG. 1, "d" here denotes the distance between the reflector face 107 and the optical component 501. "r" denotes the lateral distance of the reflection element 601 relative to one of the light-emitting components 105.

According to one example, the following equation applies:

$$\text{theta\_tilt} = \arcsin(1/n * \sin(\text{theta\_in})).$$

n is the refractive index of the optical component 501.

Figure 8:
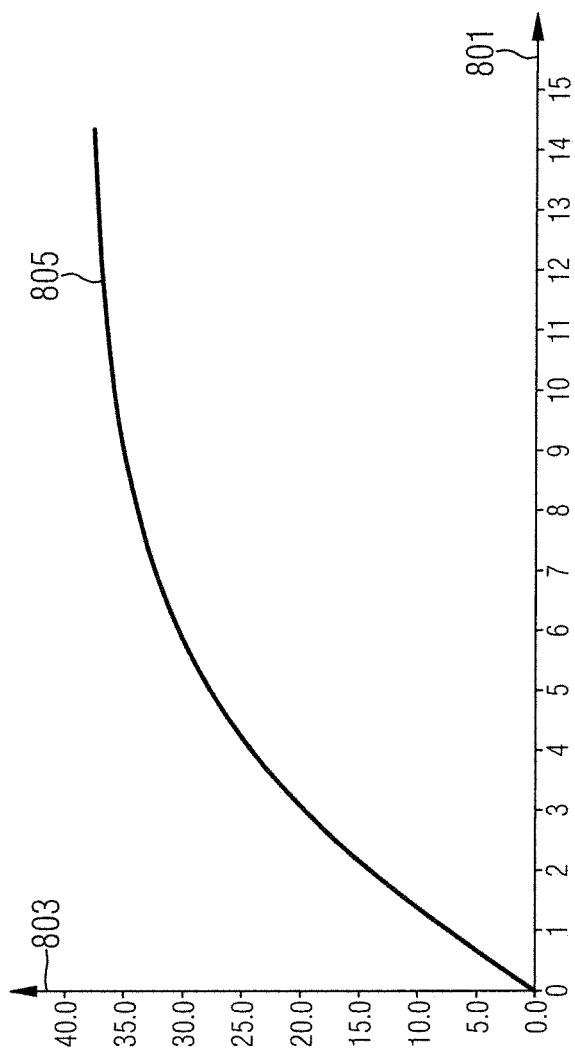
FIG. 8 shows a graphical profile of an angle between an axis of a total reflection section and a normal of a reflector face as a function of a lateral distance of the corresponding reflection element from the light-emitting component.

FIG. 8 shows the dependency of theta_tilt on the lateral distance r. The graphical profile is denoted by a curve with the reference sign 805. The axis with the reference sign 801 indicates the lateral distance r in millimeters. The axis with the reference sign 803 indicates theta_tilt in degrees.

It can be seen clearly that, with an increasing lateral distance from a light-emitting component, a total reflection section should be tilted in the direction of the reflector face 103 to achieve optimal total reflection.

Figure 9:
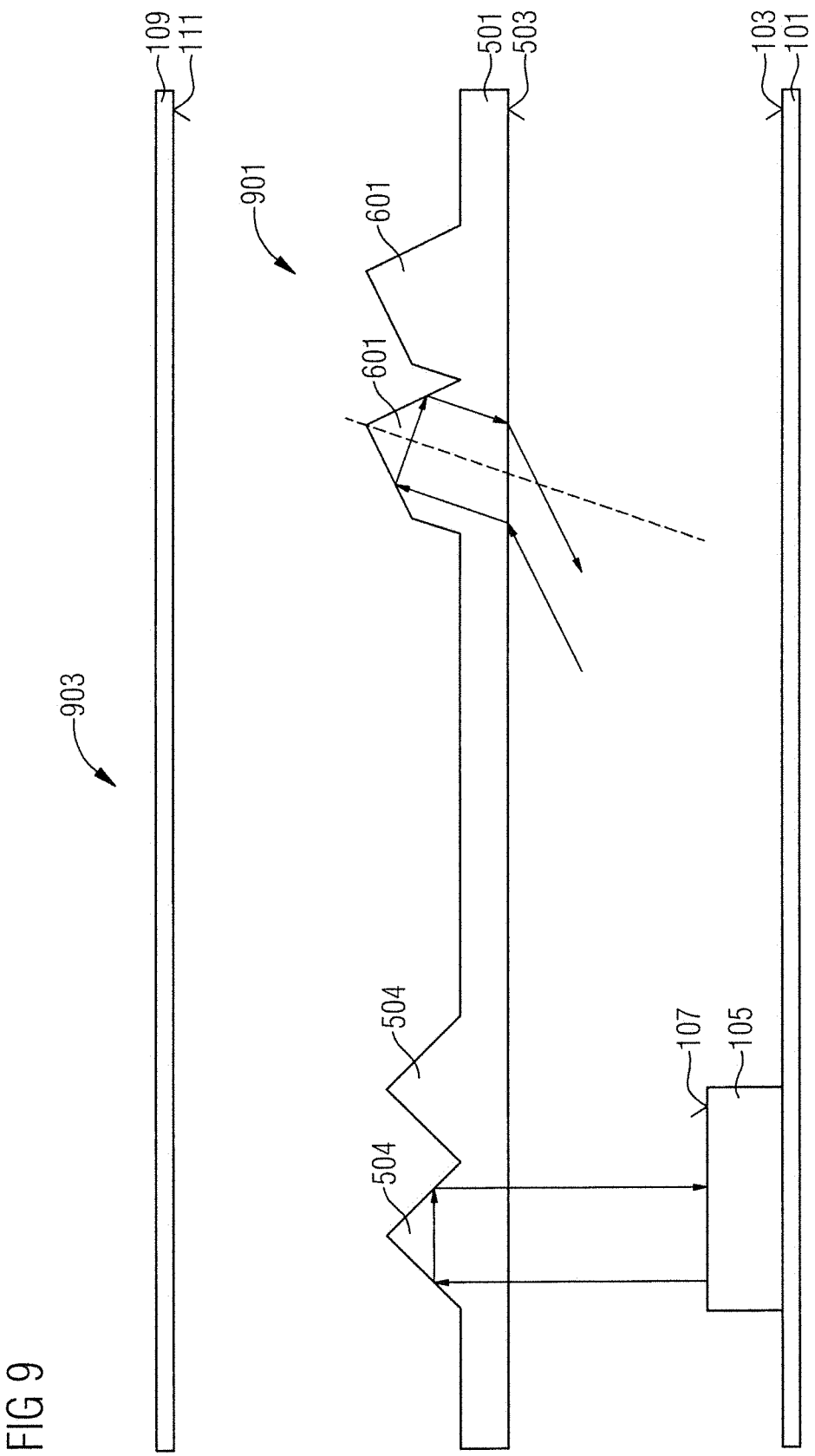
FIG. 9 shows an optoelectronic lighting apparatus.

FIG. 9 shows an optoelectronic lighting apparatus 901 comprising the reflector 101, with a light-emitting component 105 arranged on the reflector face 103, as well as the optical component 501 with the reflection elements 504, 601. The liquid-crystal display 109 is furthermore provided, the face 111 facing toward the reflector face 103.

The optical component 501 is arranged between the reflector 101 and the liquid-crystal display 109.

FIG. 9 therefore shows a display device 903 comprising the optoelectronic lighting apparatus 901 as well as a face to be illuminated, the face 111 of the liquid-crystal display 109. The optoelectronic lighting apparatus 901 therefore forms a backlighting unit for the liquid-crystal display 109.

For reasons of depiction, no further reflection elements are shown between the reflection elements 504 and the reflection elements 601. Nevertheless, according to one example, further reflection elements are also provided between the reflection elements, the further reflection elements, in relation to the reflection elements 504, 601, being configured differently therefrom. For example, respective total reflection sections of these reflection elements are inclined less greatly with their axis in the direction of the reflector face 103 than the total reflection sections of the reflection elements 601.

Although only ray paths which exhibit total reflection of the light emitted by the light-emitting face 107 are shown, nevertheless, because of total reflection not always being perfect in reality, a certain proportion of light (or generally of electromagnetic radiation) will shine through the optical component 501 in the direction of the face 111 of the liquid-crystal display 109.

Figure 10:
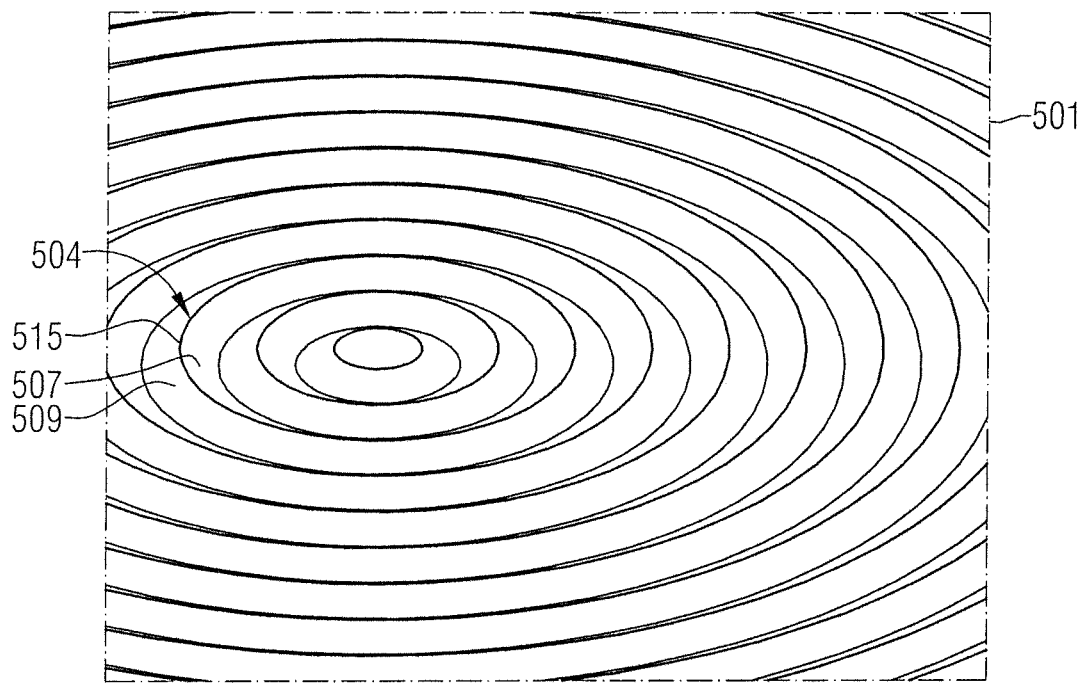
FIGS. 10 and 11 respectively show a three-dimensionally shown view of the optical component of FIGS. 5 and 6.

FIG. 10 shows a detail of the optical component 501 in the region around the reflection elements 504 in a three-dimensional view.

Figure 11:
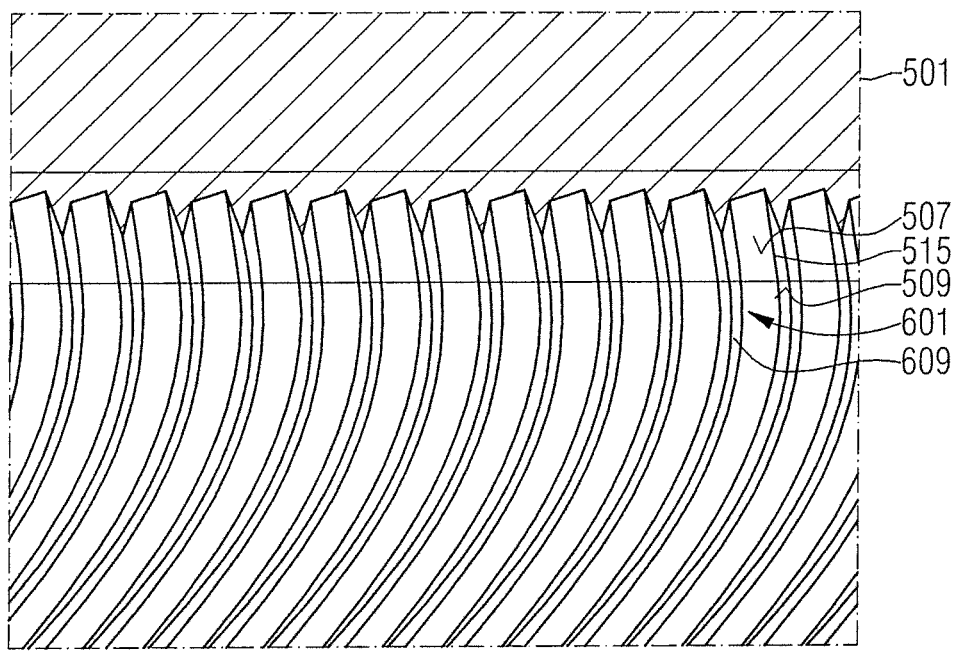

FIG. 11 shows a three-dimensional view of a region around the reflection elements 601 of the component 501.

According to the representations shown in FIGS. 10 and 11, the reflection elements 504, 601 are arranged concentrically, the corresponding center being perpendicularly above the light-emitting face 107 of one of the components 105.

Figure 12:
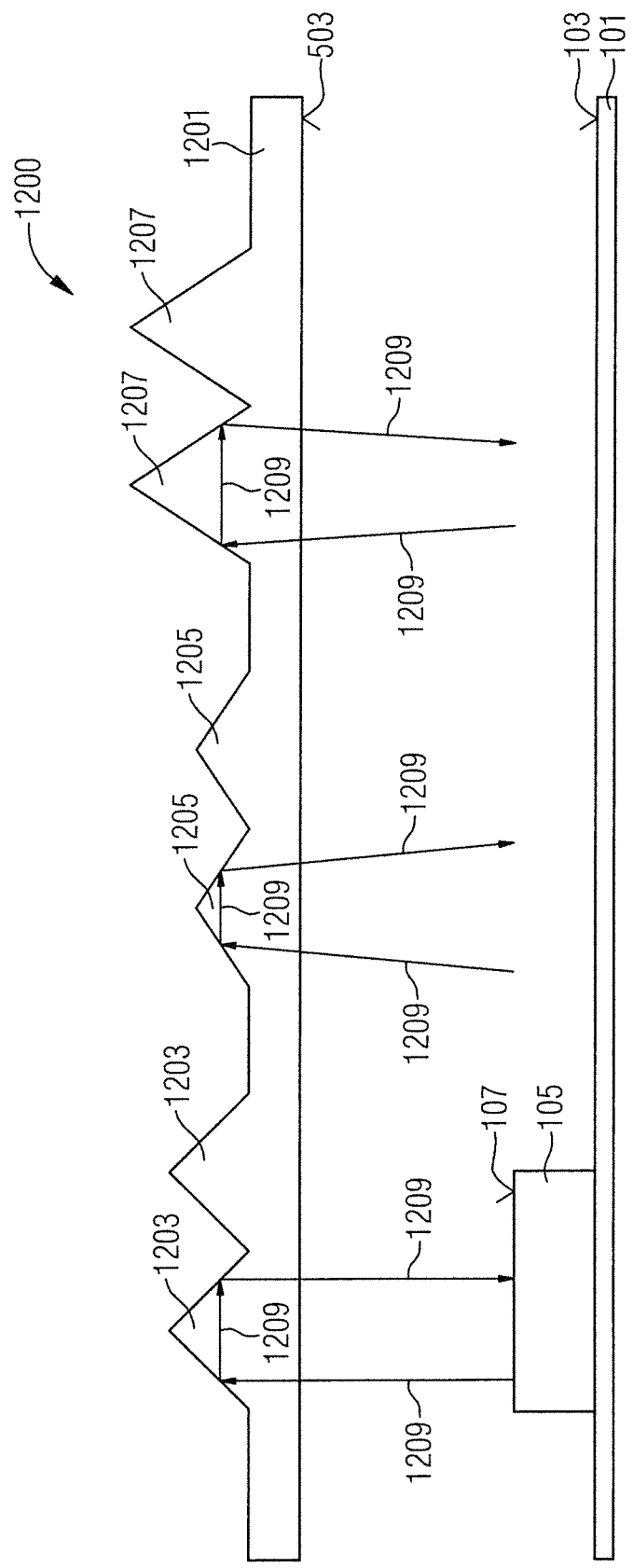
FIG. 12 shows a further optical component.

FIG. 12 shows a further optoelectronic lighting apparatus 1200.

Instead of the optical component 501, in this case an optical component 1201 is provided which has a plurality of differently configured reflection elements 1203, 1205, 1207. The reflection elements 1203, 1205, 1207 are, for example, formed as differently configured prisms or pyramids. For example, the respective prisms or pyramids differ from one another in a height relative to the lower side 503 of the optical component 1201.

At this point, the total reflection need not be perfect for efficient homogenization of the light emitted by the light-emitting face. For efficient homogenization, it is even sufficient for a proportion of at least 50% of the emitted light to be totally reflected back in the direction of the reflector face 103.

Exemplary ray paths are shown in FIG. 12 by arrows with the reference signs 1209. Even if a light ray does not enter a corresponding reflection element 1203, 1205, 1207 optimally, and although the corresponding light will not be totally reflected perfectly, but with a certain angular deviation. Nevertheless, the light will generally always be reflected back to the reflector 101 and can therefore be reflected back again by the reflector face 103 in the direction of the component 1201 to achieve further homogenization of the original Lambertian emission characteristic of the light-emitting component 105.

Figure 13:
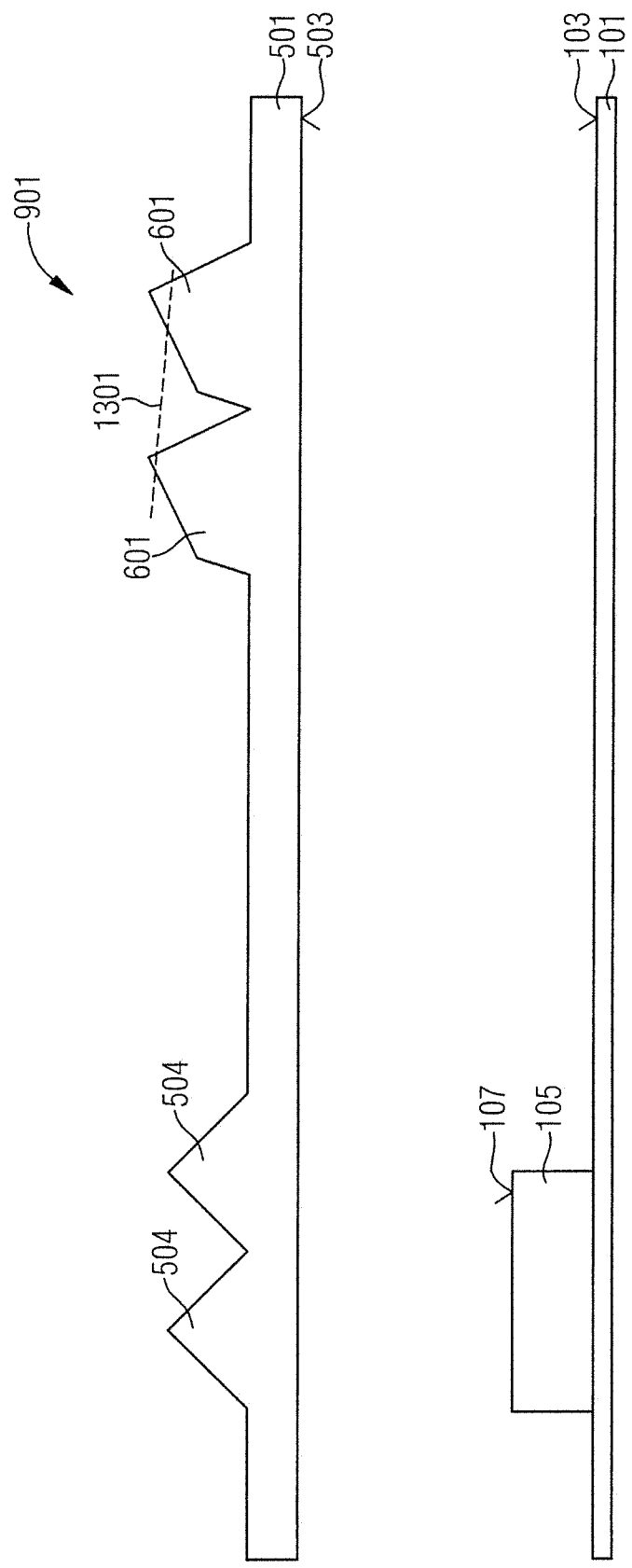
FIG. 13 shows one example of the optical component of FIGS. 5 and 6, in which a total reflection is reduced or stopped beyond a predetermined lateral distance from the light-emitting component.

FIG. 13 shows the optoelectronic lighting apparatus 901 according to FIG. 9, a truncation line 1301 through the reflection elements 601 being shown. According to one example it is provided that, the reflection elements 601 are truncated along this truncation line 1301. This means, for example, that the respective apex 515 of the prismatic sections 505 is configured to be truncated or rounded. The effect resulting from this is that the reflection elements modified in this way can no longer totally reflect the incident light as well as the unmodified reflection elements do. A reduction of the total reflection or back-reflection is thus brought about. Such selective stopping or reduction of the total reflection is carried out, in particular, for reflection elements which are located at a predetermined lateral distance from the light-emitting component 105.

This thus means that a predetermined lateral distance relative to the light-emitting component 105 is specified, the total reflection or back-reflection being selectively stopped, or reduced, for reflection elements located at a lateral distance from the light-emitting component 105 which is greater than the predetermined distance. This is done, for example, by apices or corners being formed as flattened or rounded or truncated apices or corners. According to one example, the optical component has regions free of reflection elements. In these regions, also referred to as transmission regions, emitted electromagnetic radiation can shine directly through the component without being reflected back.

Figure 14:
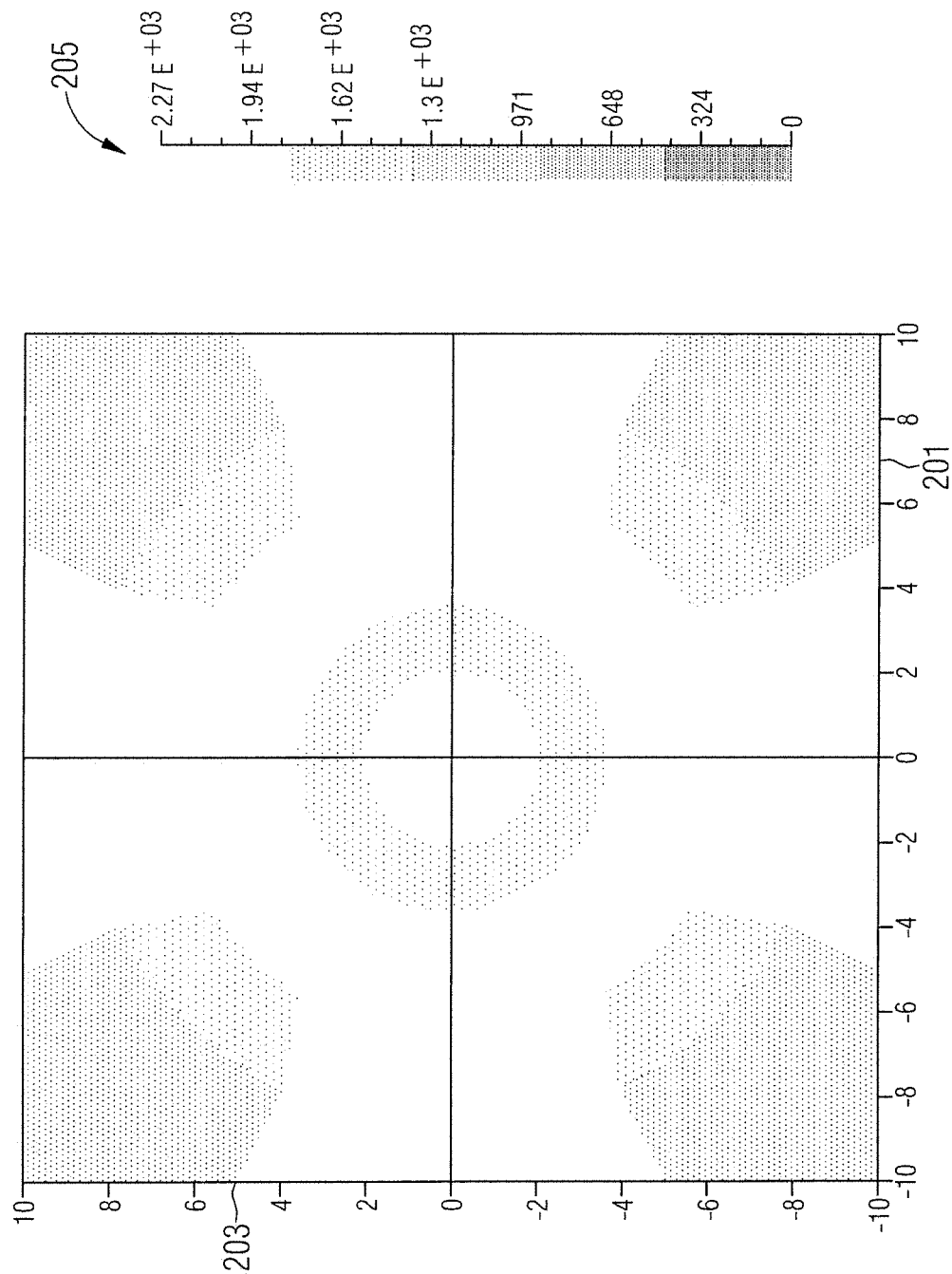
FIG. 14 shows an illuminance distribution in the optoelectronic lighting apparatus of FIG. 9.

FIGS. 14 to 16 show, respectively in a similar way to FIGS. 2 to 4, an illuminance distribution for the optoelectronic lighting apparatus 901. In this case, a distance of 20 mm between two light-emitting components has been selected. A distance between the reflector and the face to be illuminated is 5 mm. No additional optical elements, for example, lenses or films are provided between the optical component and the face to be illuminated.

Nevertheless, an improved, i.e., in particular more homogeneous, illuminance distribution is achieved merely because of the optical component with the differently configured reflection elements.

FIG. 15 shows, in a similar way to FIG. 2, a sectional representation through the illuminance distribution shown in FIG. 14, wherein y=0.

FIG. 16 shows a section through the illuminance distribution shown in FIG. 14, wherein x=0.

A ratio of minimum illuminance to maximum illuminance (E min/E max) is in this case greater than 70% with an efficiency of more than 80%.

In summary, we provide an optical component between the reflector, having the light-emitting elements, and faces to be illuminated, which provides differently configured reflection elements formed, for example, as back-reflecting structures. The reflection elements are formed, for example, as prisms, pyramids or as cones. A base face of a prism or of a pyramid is, for example, triangular or quadrilateral. Such structures reflect project the light back in the direction of the reflector by total reflection with a high efficiency.

For example, the reflection elements are locally inclined in the direction of the reflector face. This achieves a high efficiency for different lateral distances from a light-emitting component. The prisms, or the pyramids, or the cones are, for example, oblique.

The optical component is arranged at a distance from the light-emitting components. The light-emitting components therefore respectively span a small solid angle as seen from the position of the optical component so that a defined and small solid angle is specified which allows efficient deviation of the light.

The following advantage is furthermore obtained. Positioning of the light-emitting components with respect to the optical component is relatively tolerant. For example, a tolerance both in the distance between the optical component and the reflector face, as well as a lateral distance, is a few 100 μm.

For example, the optical component is formed as a film or as a plate so that the optical component can cover the entire reflector. A component formed in this way is generally economical to produce, and can be mounted efficiently and economically.

The optical component is, in particular, formed from a material with a high refractive index so that the total reflection can also be achieved efficiently for such light which is not perfectly incident from the direction of the light-emitting component.

Since the optical component achieves homogenization of the illuminance distribution of the emitted electromagnetic radiation, the optical component may also be referred to as a homogenizer.

Although our apparatus and devices have in detail been illustrated and described in detail by preferred examples, this disclosure is not restricted by the examples disclosed, and other variants may be derived therefrom by those skilled in the art, without departing from the protective scope of the appended claims.

This application claims priority of DE 10 2016 100 063.9, the subject matter of which is incorporated herein by reference.

The invention claimed is:

1. An optoelectronic lighting apparatus, comprising:
a reflector having a reflector face;
an optical component arranged at a distance from the reflector face and opposite the reflector face; and
a light-emitting component arranged on the reflector face and having a light-emitting face,
wherein the optical component has a plurality of differently configured reflection elements for reflection, in a direction of the reflector face, of electromagnetic radiation emitted by the light-emitting face,
the plurality of reflection elements at least partially comprise a total reflection section for total reflection of at least one part of the emitted electromagnetic radiation in the direction of the reflector face,
the respective total reflection section is an element selected from the group of total reflection sections consisting of pyramidal section, conical section and prismatic section,
a respective angle between a straight line extending from an apex of the total reflection section to a midpoint of a base face of the total reflection section and a normal of the reflector face for at least some reflection elements with a larger lateral distance from the light-emitting component is greater than for reflection elements with a smaller lateral distance from the light-emitting component, and
the respective angle is proportional to $\arcsin(1/n*\sin(\arctan(r/d))$ with a tolerance of +/−10°, where n is a refractive index of the optical component, d is a distance of the light-emitting face from the optical component, and r is the lateral distance of the corresponding reflection element from the light-emitting component.

2. The optoelectronic lighting apparatus according to claim 1, wherein at least one reflection element at least partially has a side face oriented parallel to the respective straight line and arranged closer to the light-emitting component than the total reflection section.

3. The optoelectronic lighting apparatus according to claim 1, wherein beyond a predetermined lateral distance from the light-emitting component, the reflection elements are configured such that the total reflection of the at least one part of the emitted electromagnetic radiation is reduced or stopped.

4. The optoelectronic lighting apparatus according to claim 1, wherein a lower side, facing toward the reflection face, of the optical component is structured and/or curved.

5. The optoelectronic lighting apparatus according to claim 1, wherein the plurality of reflection elements are arranged concentrically around the light-emitting component or linearly.

6. The optoelectronic lighting apparatus according to claim 1, wherein the optical component is formed as an extruded or injection-molded optical component.

7. The optoelectronic lighting apparatus according to claim 1, wherein the plurality of reflection elements are formed as stamped reflection elements.

8. The optoelectronic lighting apparatus according to claim 1, wherein a plurality of light-emitting components are arranged on the reflector face with their respective light-emitting face facing away from the reflection face, and a mirror axis extending perpendicularly to the optical component and centrally between two light-emitting components is defined so that two sections of the optical component formed mirror-symmetrically and comprise reflection elements are formed on both sides of the mirror axis, the sections respectively extending from the mirror axis to a distance from the optical axis corresponding to half the distance between the two corresponding light-emitting components.

9. The optoelectronic lighting apparatus according to claim 1, comprising a display device with a face to be illuminated;
wherein the optical component is arranged between the reflector and the face to be illuminated.

10. An optoelectronic lighting apparatus, comprising:
a reflector having a reflector face;
an optical component arranged at a distance from the reflector face and opposite the reflector face; and
a light-emitting component arranged on the reflector face and having a light-emitting face,
wherein the optical component has a plurality of differently configured reflection elements for reflection, in a direction of the reflector face, of electromagnetic radiation emitted by the light-emitting face,
the reflection elements are selected from the group consisting of a pyramid, a cone and a prism,
the plurality of reflection elements at least partially comprise a total reflection section for total reflection of at least one part of the emitted electromagnetic radiation in the direction of the reflector face,
the respective total reflection section is an element selected from the group of total reflection sections consisting of pyramidal section a conical section and a prism section,
a respective angle between a straight line extending from an apex of the total reflection section to a midpoint of a base face of the total reflection section and a normal of the reflector face for at least some reflection elements with a larger lateral distance from the light-emitting component is greater than for reflection elements with a smaller lateral distance from the light-emitting component,
wherein at least one reflection element is tilted such that the straight line of this reflection element is inclined in the direction of the light-emitting component, and
wherein the tilted reflection elements has at an inner side a lower side face oriented within a range of +/−10 degrees parallel to the respective straight line of the reflection element, wherein the lower side face of the inner side is arranged with an angle with regard to the inner side of the total reflection section of the reflection element, wherein the inner side is arranged closer to the light-emitting component than the total reflection section.

11. The optoelectronic lighting apparatus according to claim 10, wherein beyond a predetermined lateral distance from the light-emitting component, the reflection elements are configured such that the total reflection of the emitted electromagnetic radiation is stopped.

12. The optoelectronic lighting apparatus according to claim 10, wherein the total reflection sections are arranged at an upper side of the optical component, and a lower side of the optical component facing toward the reflection face is structured.

13. The optoelectronic lighting apparatus according to claim 10, wherein the plurality of reflection elements are arranged concentrically around the light-emitting component.

14. The optoelectronic lighting apparatus according to claim 10, wherein a plurality of light-emitting components are arranged on the reflector face with their respective light-emitting face facing away from the reflection face, and a mirror axis extending perpendicularly to the optical component and centrally between two light-emitting components is defined so that two sections of the optical component formed mirror-symmetrically and comprise reflection elements are formed on both sides of the mirror axis, the sections respectively extending from the mirror axis to a distance from the optical axis corresponding to half the distance between the two corresponding light-emitting components.

15. The optoelectronic lighting apparatus according to claim 10, wherein the reflection elements are selected from the group consisting of a three-dimensional pyramid, a three-dimensional prism and a three-dimensional cone.

16. The optoelectronic lighting apparatus according to claim 10, wherein the plurality of reflection elements are arranged linearly around the light-emitting component.

17. The optoelectronic lighting apparatus according to claim 10, wherein the total reflection sections are arranged at an upper side of the optical component, and a lower side of the optical component facing toward the reflection face is curved.

18. The optoelectronic lighting apparatus according to claim 11, wherein beyond the predetermined lateral distance from the light-emitting component the reflection elements comprise apices or corners being formed as flattened or rounded or truncated apices or corners.

19. The optoelectronic lighting apparatus according to claim 10, wherein the optical component has a region that is free of reflection elements, and in the region electromagnetic radiation emitted from the light-emitting component can shine directly through the optical component without being reflected back.

20. The optoelectronic lighting apparatus according to claim 10, wherein the tilted reflection element has at an inner side a lower side face oriented parallel to the respective straight line of the tilted reflection element.

* * * * *